(12) United States Patent
Yanagisawa

(10) Patent No.: US 6,272,227 B1
(45) Date of Patent: Aug. 7, 2001

(54) SIMULTANEOUS TWO-WAY COMMUNICATION APPARATUS USING EAR MICROPHONE

(75) Inventor: Hiroaki Yanagisawa, Tokyo (JP)

(73) Assignee: Temco Japan Co, Ltd, Tokyo (JP)

( * ) Notice: Subject to any disclaimer, the term of this patent is extended or adjusted under 35 U.S.C. 154(b) by 0 days.

(21) Appl. No.: 09/159,669

(22) Filed: Sep. 24, 1998

(51) Int. Cl.⁷ ........................................................ H03G 3/00
(52) U.S. Cl. .............................................. 381/104; 381/106
(58) Field of Search ............................. 381/104, 74, 107, 381/123, 312, 325, 321, 91

(56) References Cited

U.S. PATENT DOCUMENTS 6,128,383 * 10/2000 Takeyama ............................. 381/104

* cited by examiner

*Primary Examiner*—Minsun Oh Harvey
(74) *Attorney, Agent, or Firm*—Browdy & Neimark

(57) ABSTRACT

The apparatus eliminates howls to permit a received sound to increase in sound volume to enable the apparatus to be used in high-noise areas, and comprises: a transceived sound volume control circuit 10 for controlling in sound volume a transceived sound, the circuit 10 being interposed between: an ear microphone 1 containing a microphone 4 and a speaker 5; and, a communication system 20 such as PHS. The circuit 10 comprises: a communication switching means 16 for performing a switching operation in communications; high-frequency-signal cutting means 17, 19, which attenuate a received sound signal in a transmission mode and then cut a high-frequency component of the signal; and, a transmitted-sound-signal attenuating means 15 for attenuating a transmitted-sound signal in a reception mode. The apparatus comprises a means 14 for cutting energy in the vicinity of a resonance point of the microphone 4, and a means 12 for detecting energy in the vicinity of the first formant of a sound to prevent the switching operation from being initiated due to extraneous noises.

4 Claims, 1 Drawing Sheet

SIMULTANEOUS TWO-WAY COMMUNICATION APPARATUS USING EAR MICROPHONE

BACKGROUND OF THE INVENTION

1. Field of the Invention

The present invention relates to a simultaneous two-way communication apparatus using an ear microphone, incorporated in which are: a microphone or pickup mechanism for picking up bone conduction sounds (i.e., vibrations) in a user's external auditory meatus; and, a sound-pressure type speaker unit.

2. Description of the Related Art

Due to its howling problem, the ear microphone capable of performing the simultaneous two-way communication is restricted in sound volume of its received sound. In other words, the ear microphone has no problem when used in a noiseless environment, but encounters difficulties in communication when used in a high-noise environment. Such difficulties often makes it substantially impossible for the user to use the ear microphone. Especially, most of the ear microphones each using an acceleration type pickup unit have their resonance points in a frequency range of from about 2 to about 5 KHz, and, therefore are apt to raise howls in use.

As described above, in the ear microphone, particularly, in the simultaneous two-way communication type ear microphone using the acceleration type pickup unit, there is found the howling problem. Due to its howling problem, the simultaneous two-way communication type ear microphone is not capable of sufficiently increasing in sound volume its received sound, and, therefore disadvantageous in this respect.

SUMMARY OF THE INVENTION

Consequently, it is an object of the present invention to provide a simultaneous two-way communication apparatus using an ear microphone, which solves a howling problem encountered in transceiving sound signals, permits a user to increase in sound volume his received sound, and also permits the user to use this communication apparatus even in a high-noise environment and the like.

According to a first aspect of the present invention, the above object of the present invention is accomplished by providing:

A simultaneous two-way communication apparatus using an ear microphone, comprising:

a transceived sound volume control circuit, which controls in sound volume a sound being transceived, and is interposed between: an ear microphone containing both a microphone and a speaker unit; and, a communication system such as a PHS communication system and like communication systems;

the transceived sound volume control circuit comprising: a communication switching means for performing a switching operation in communications; a high-frequency-signal cutting means, which attenuates a received sound signal in a transmission mode and then cuts a high-frequency signal contained in the received sound signal thus attenuated; and, a transmitted-sound-signal attenuating means for attenuating a transmitted-sound signal in a reception mode.

According to a second aspect of the present invention, the above object of the present invention is accomplished by providing:

The simultaneous two-way communication apparatus using the ear microphone, as set forth in the first aspect of the present invention, wherein:

the simultaneous two-way communication apparatus further comprises a means for cutting energy in the vicinity of a resonance point of the microphone.

According to a third aspect of the present invention, the above object of the present invention is accomplished by providing:

The simultaneous two-way communication apparatus using the ear microphone, as set forth in the first or the second aspect of the rpesent invention, wherein:

the simultaneous two-way communication apparatus still further comprises a means for detecting energy in the vicinity of the first formant of a sound in order to prevent the switching operation from being initiated due to extraneous noises and the like.

DESCRIPTION OF THE PREFERRED EMBODIMENT

Hereinbelow, the present invention will be described in detail with reference to the accompanying drawings.

Figure 1:
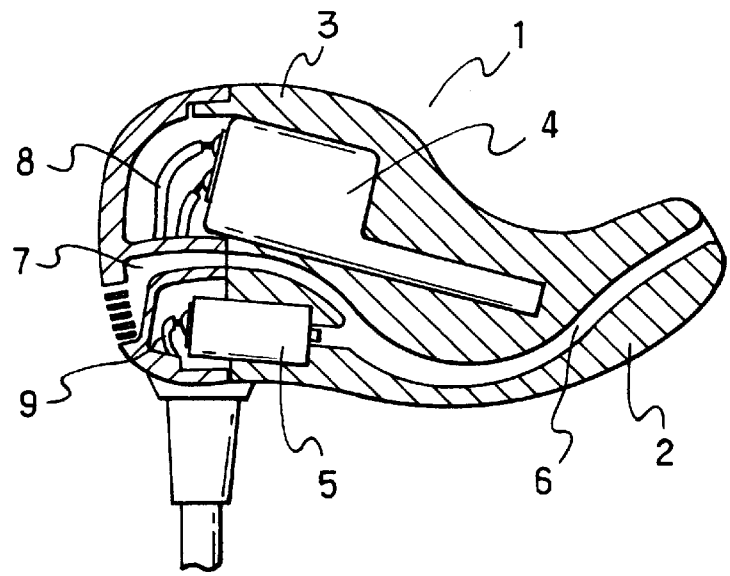
FIG. 1 is a longitudinal sectional view of the ear microphone used in the simultaneous two-way communication apparatus of the present invention.

FIG. 1 shows a longitudinal sectional view of a simultaneous two-way communication apparatus using an ear microphone according to the present invention. As shown in FIG. 1, the ear microphone is provided with an ear piece 1.

In general, the ear piece 1 is made of plastics and provided with an insertion portion 2, which assumes an appropriate curved form capable of being inserted into a user's external auditory meatus so as to be brought into close contact therewith. The ear piece 1 is further provided with an ear piece body 3, which contains both a microphone (i.e., pickup mechanism) 4 and a speaker unit 5 therein.

The microphone 4 is constructed of: a sensor portion for sensing the user's voice as a bone conduction sound signal (i.e., vibration) transmitted to a wall of the user's external auditory meatus; and, a vibration picking up device for converting the vibration thus sensed in the above sensor portion into an electric signal.

The ear piece 1 shown in FIG. 1 is provided with a sound conduit 6, which extends from the speaker unit 5 to a front end of the insertion portion 2 of the ear piece 1. Further, formed inside the ear piece 1 is a duct 7, which extends from a rear surface of the ear piece body 3 to the front end of the insertion portion 2. A front half of this duct 7 is communicated with the sound conduit 6.

The ear microphone having the above construction is connected with a communication system 20 such as a PHS communication system and like communication systems through a transceived sound volume control circuit 10.

As for this transceived sound volume control circuit 10, in view of the fact that, in telephone conversation, most of the speaker (i.e., talkers) are apt to listen only distractedly to their conversation partners when in talking, the control circuit 10 functions to automatically reduce in sound volume a received sound when a user of the simultaneous two-way communication apparatus of the present invention is talking in communication.

Figure 2:
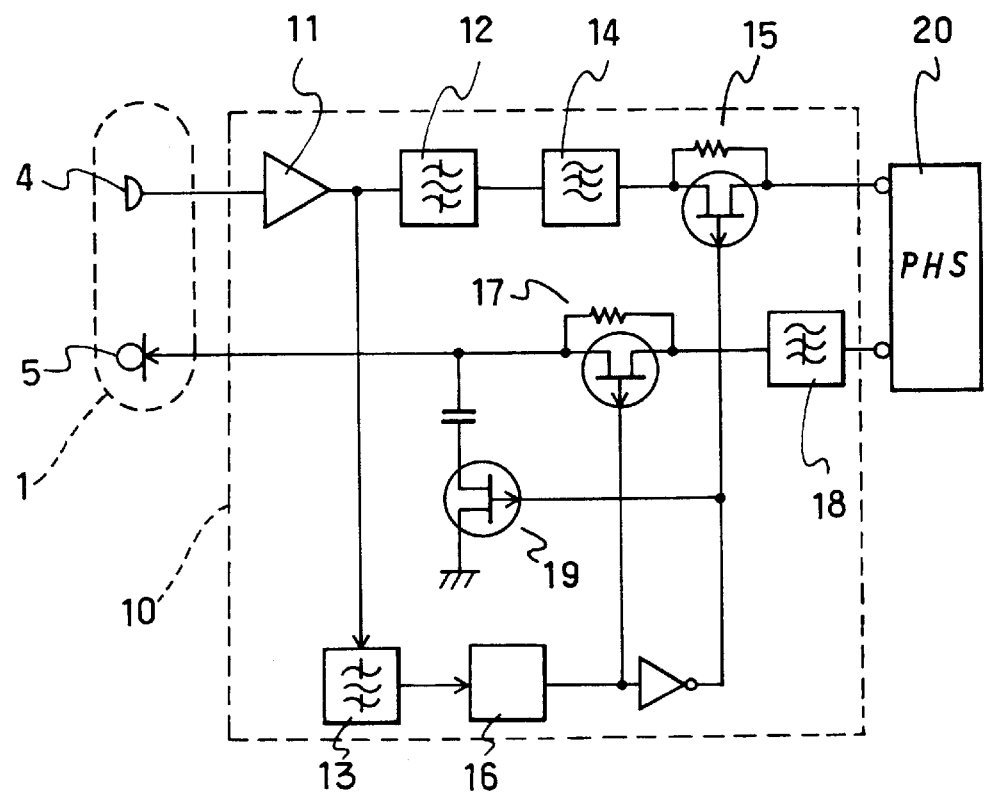
FIG. 2 is a circuit diagram of the transceived sound volume control circuit of the ear microphone used in the communication apparatus of present invention shown in FIG. 1.

FIG. 2 shows a circuit diagram of the transceived sound volume control circuit 10. In FIG. 2: the reference numeral 11 denotes an amplifier; 12 a band-pass filter (i.e., BPF); and, 13 another band-pass filter (i.e., BPF).

In the transmission mode, an electric signal issued from the microphone 4 is received by the amplifier 11, and amplified therein. The thus amplified signal is then supplied to both the band-pass filters (i.e., BPF's) 12, 13. The BPF 12 functions to selectively detect energy in the vicinity of the first formant (i.e., characteristic frequency band) of a sound in order to prevent a switching operation in communication from being initiated due to extraneous noises and like extraneous factors. If necessary, a notch filter 14 is interposed between the BPF 12 and an transmission use attenuator 15 to ensure that energy in the vicinity of a resonance point of the microphone 4 is cut, so that a howling problem is completely eliminated in the communication apparatus of the present invention.

In a reception mode of the apparatus of the present invention, when a sound signal reaches the microphone 4, the sound signal is converted into an electric signal in the microphone 4. The thus converted electric signal is then issued from the microphone 4 to a voice-operated transmitter keyer (i.e., VOX) 16 through the band-pass filter (i.e., BPF) 13, so that the communication apparatus of the present invention having been in the reception mode enters its transmission mode.

Upon entrance to this transmission mode, a signal or initiating an attenuation operation is supplied to a reception use attenuator 17, so that the received sound signal is considerably attenuated.

In construction, provided in an output terminal of the reception use attenuator 17 is a circuit 19 serving as a high-frequency-signal cutting means. This circuit 19 functions to attenuate the received sound signal in the transmission mode and then cuts a high-frequency signal contained in the received sound signal thus attenuated, the high-frequency signal being apt to cause the howling problem.

In the reception mode, the received sound signal is supplied to the speaker unit 5 through a high-pass filter 18. At the same time, the VOX 16 having been in the transmission mode enters its reception mode, so that attenuation in the transmission use attenuator 15 is enhannced, whereby the transmitted sound signal is considerably attenuated.

On the other hand, the high-pass filter 18 functions to attenuate the low-frequency components of an output signal issued from the speaker unit 5 in order to prevent the switching operation in communication from being initiated due to a loudish output sound isssued from the speaker unit 5.

Incidentally, when the switching operation in communication is performed with a click, such click often gives the user a feeling of physical disorder. Consequently, the switching operation in communication is carried out in a communication switching circuit using an analog switch, which is free from any DC variations.

In the communication apparatus of the present invention having the above construction, the transceived sound volume control circuit is interposed between the ear microphone and the communication system such as the PHS communication system and like communication systems. Due to this: in the transmission mode, the received sound is automatically and considerably reduced in sound volume, and the high-frequency components of the received sound signal are cut; and, in the reception mode, the transmitted sound is automatically and considerably reduced in sound volume, which prevents the howling problem from occurring in both the transmission and the reception mode, and, therefore permits the communication apparatus of the present invention to be used without any disadvantages even in a high-noise area and like places.

What is claimed is:

1. A simultaneous two-way communication apparatus using an ear microphone, comprising:

a transceived sound volume control circuit, which controls in sound volume a sound being transceived, and is interposed between: an ear microphone containing both a microphone and a speaker unit; and, a communication system such as a PHS communication system and like communication systems;

said transceived sound volume control circuit comprising:
a communication switching means for performing a switching operation in communications; a high-frequency signal cutting means, which attenuates a received sound signal in a transmission mode and then cuts a high-frequency signal contained in said received sound signal thus attenuated; and, a transmitted-sound-signal attenuating means for attenuating a transmitted-sound signal in a reception mode; and wherein said simultaneous two-way communication apparatus further comprises a means for detecting energy in the vicinity of the first formant of a sound in order to prevent said switching operation from being initiated due to extraneous noises and like extraneous factors.

2. A simultaneous two-way communication apparatus using an ear microphone, comprising:

a transceived sound volume control circuit, which controls in sound volume a sound being transceived, and is interposed between: an ear microphone containing both a microphone and a speaker unit; and, a communication system such as a PHS communication system and like communication systems;

said transceived sound volume control circuit comprising:
a communication switching means for performing a switching operation in communications; a high-frequency signal cutting means, which attenuates a received sound signal in a transmission mode and then cuts a high-frequency signal contained in said received sound signal thus attenuated; and, a transmitted-sound-signal attenuating means for attenuating a transmitted-sound signal in a reception mode; and wherein said simultaneous two-way communication apparatus further comprises a means for cutting energy in the vicinity of a resonance point of said microphone.

3. The simultaneous two-way communication apparatus using the ear microphone, as set forth in claim 2, wherein:
said simultaneous two-way communication apparatus still further comprises a means for detecting energy in the vicinity of the first formant of a sound in order to prevent said switching operation from being initiated due to extraneous noises and like extraneous factors.

4. The simultaneous two-way communication apparatus using the ear microphone, as set forth in claim 2, wherein:
said simultaneous two-way communication apparatus still further comprises a means for detecting energy in the vicinity of the first formant of a sound in order to prevent said switching operation from being initiated due to extraneous noises and like extraneous factors.

* * * * *